United States Patent
McDermott et al.

[11] Patent Number: 6,141,870
[45] Date of Patent: Nov. 7, 2000

[54] METHOD FOR MAKING ELECTRICAL DEVICE

[75] Inventors: Brian J. McDermott, Winter Springs; Daniel McGowan, Casselberry; Ralph Leo Spotts, Jr., Lake Mary; Sid Tryzbiak, Winter Springs, all of Fla.

[73] Assignee: Peter K. Trzyna, Chicago, Ill.

[21] Appl. No.: 08/905,619

[22] Filed: Aug. 4, 1997

[51] Int. Cl.⁷ .................................................. H01K 3/10
[52] U.S. Cl. ................................ 29/852; 29/825; 29/830; 427/97
[58] Field of Search ............................ 29/852, 830, 825; 427/97

[56] References Cited

U.S. PATENT DOCUMENTS

| | | |
|---|---|---|
| 3,228,104 | 1/1966 | Rmeis . |
| 3,808,028 | 4/1974 | Lando . |
| 4,196,923 | 4/1980 | Zimmerli et al. . |
| 4,216,246 | 8/1980 | Iwasaki et al. . |
| 4,364,792 | 12/1982 | Gliem et al. . |
| 4,615,763 | 10/1986 | Gelorme et al. . |
| 4,642,163 | 2/1987 | Greschner et al. . |
| 4,688,015 | 8/1987 | Kojima et al. . |
| 4,700,879 | 10/1987 | Weidenauer et al. . |
| 4,832,988 | 5/1989 | Bogenschutz et al. . |
| 4,913,784 | 4/1990 | Bogenschutz et al. . |
| 4,927,983 | 5/1990 | Jones et al. . |
| 4,941,940 | 7/1990 | Gordhanbhai et al. . |
| 4,948,630 | 8/1990 | Courduvelis et al. . |
| 4,948,707 | 8/1990 | Johnson . |
| 4,978,569 | 12/1990 | Keep . |
| 4,997,122 | 3/1991 | Zimmer . |
| 5,015,329 | 5/1991 | Patel et al. . |
| 5,049,230 | 9/1991 | Patel et al. . |
| 5,058,799 | 10/1991 | Zsamboky . |
| 5,082,359 | 1/1992 | Kirkpatrick . |
| 5,097,593 | 3/1992 | Jones . |
| 5,108,825 | 4/1992 | Wojnarowski et al. . |
| 5,156,896 | 10/1992 | Katoh et al. . |
| 5,160,090 | 11/1992 | Friedrich et al. . |
| 5,178,965 | 1/1993 | Tench et al. . |
| 5,242,711 | 9/1993 | DeNatale . |
| 5,250,319 | 10/1993 | Ohsako . |
| 5,258,098 | 11/1993 | Waganer et al. . |

(List continued on next page.)

OTHER PUBLICATIONS

Alphametals Alpha–Fry Group; *Material Safety Data Sheet* Jul. 14, 1995 pp. 1–6 Circuposit (R) MLB Prometer 2/3A.

Shipley Company, Inc.; *Material Safety Data Sheet* Oct. 23, 1995 pp.1–6.

Problec XB 7081 Photodielectric; *Provisional Technical Data Sheet* Oct. 1996 pp. 1–8.

Shipley Company Inc.; *Material Safety Data Sheet*, Circuposit MLB Conditions 211 Sep. 7, 1996 pp. 1–6.

Shipley Company Inc.; *Material Safety Data Sheet*, Circuposit MLB Prometer 213B, Aug. 15, 1996 pp. 1–6.

Shipley Company Inc.; Material Safety Data Sheet, Circuposit MLB Neutralizer 216 Aug. 15, 1996, pp. 1–4.

*Primary Examiner*—Carl J. Arbes
*Attorney, Agent, or Firm*—Peter K. Trzyna

[57] ABSTRACT

A multilayer electrical device such as a printed circuit board, and method for making the electrical device, having a tooth structure for joining at least one of the layers. The method includes the following steps: providing a base; preparing the base and adding a conductive layer to the base; applying a dielectric material to the conductive layer; preparing the applied dielectric material for receipt of the conductive coating; forming openings (vias) through holes in the applied dielectric coating; etching cavities in the applied dielectric material; applying a conductive coating to the cavities in the applied dielectric material; and forming a metal layer on the conductive coating to produce a tooth structure set in the dielectric coating. The tooth structure preferably has obtuse teeth in the range of 1–2 tenths of a mil deep that mechanically join a dielectric material to a subsequently added metal layer.

6 Claims, 2 Drawing Sheets

U.S. PATENT DOCUMENTS

| | | |
|---|---|---|
| 5,264,325 | 11/1993 | Allen et al. . |
| 5,435,889 | 7/1995 | Dietrich . |
| 5,439,766 | 8/1995 | Day et al. . |
| 5,451,721 | 9/1995 | Tsukada et al. . |
| 5,510,156 | 4/1996 | Zhao . |
| 5,558,789 | 9/1996 | Singh . |
| 5,653,841 | 8/1997 | Krishnamurthy et al. ............ 29/852 X |
| 5,745,984 | 5/1998 | Cole, Jr. et al. ...................... 29/852 X |

6,141,870

METHOD FOR MAKING ELECTRICAL DEVICE

FIELD OF THE INVENTION

The present invention is directed to methods for making or manufacturing an electrical device, and the process, composition, and product thereof. More particularly, the present invention involves such multilayer electrical devices as circuit boards constructed by joining a dielectric material to a subsequently applied conductive material. Still more particularly, the present invention involves an electrical device having a substrate or base, an applied dielectric material thereon, which in turn has a thin conductive coating thereon, and a conductive layer formed upon the conductive coating, the conductive layer being joined to the applied dielectric material in an improved manner.

BACKGROUND OF THE INVENTION

Multilayer electrical devices—those made from layering a dielectric material and a conductive material on a base—suffer from delamination, blistering, and other reliability problems. This is particularly true when the laminates are subjected to thermal stress.

Known attempts to solve these problems seem to have focused on physical or chemical roughening, particularly of the base or substrate. See for example, U.S. Pat. No. 4,948,707. Although oxide-related chemical roughening processes have been used, an emphasis on physical roughening may reflect the use of materials that are relatively chemically resistant. Both physical and chemical roughening approaches have improved adherence to the base.

However, the extent to which this adherence can be increased by roughening has its limits. And despite a long standing recognition of delamination, blistering, and reliability problems, and the attempts to find a solution, these problems have been persistent in electrical devices made of layered materials.

SUMMARY OF THE INVENTION

The inventors herein have observed that the general problem of poor adherence between the laminates or layers can be addressed by forming a unique surface structure, which is particularly suitable for joining the dielectric material to the conductive coating and conductive layer. The surface structure is comprised of teeth that are preferably angled or hooked like fangs or canine teeth to enable one layer to mechanically grip a second layer.

In comparison with the above-mentioned roughening techniques of the prior art, it is believed that a surface of the teeth is an improvement in that there is an increase in surface area. However, it is still better to use teeth that are fang-shaped to enable a mechanical grip that functions in a different manner than adherence by means of increased surface area. By using the fanged, angled, canine, or otherwise hooked teeth (in addition to increased surface area), there is a multidirectional, three dimensional interlacing or overlapping of layers. For example, in joining the dielectric material to the conductive coating and metal layer, the conductive coating and metal layer is actually burrowed in and under the dielectric material and vice versa. Thus, separating them not only involves breaking the surface area adherence, but also involves destroying the integrity of at least one of the layers by ripping the teeth, the layer pierced by them, or both.

Further, it has been found preferable to have numerous teeth sized and shaped so that they are not too large or too small. If the teeth are too small, wide, straight, and shallow, then the surface resembles the roughened surface of prior art techniques, vaguely analogous to a surface of molar teeth, and the adherence is not much better than that achieved by known prior art roughening techniques.

However, if the teeth are too large, deep, and fanged or hook-shaped, the teeth undercut the surface to such an extent that the strength of the dielectric material surface is weakened. As a result, adherence is decreased over the preferred embodiment.

Not too great and not too slight, the right sized and shaped teeth, set in a fanged orientation and with sufficient frequency, have been found to be the best structure. If the correct balance of these critically important factors is created, the result is a greatly improved circuit board or other such electrical device.

It is theorized by the inventors that the best methods for producing the teeth is to use non-homogeneous materials and/or techniques. For example, a dielectric material can have a non-homogeneous composition or thickness to bring about an uneven chemical resistance, such that slowed and/or repeated etching will form teeth instead of a uniform etch.

DETAILED DESCRIPTION OF THE DRAWINGS

Figure 1:
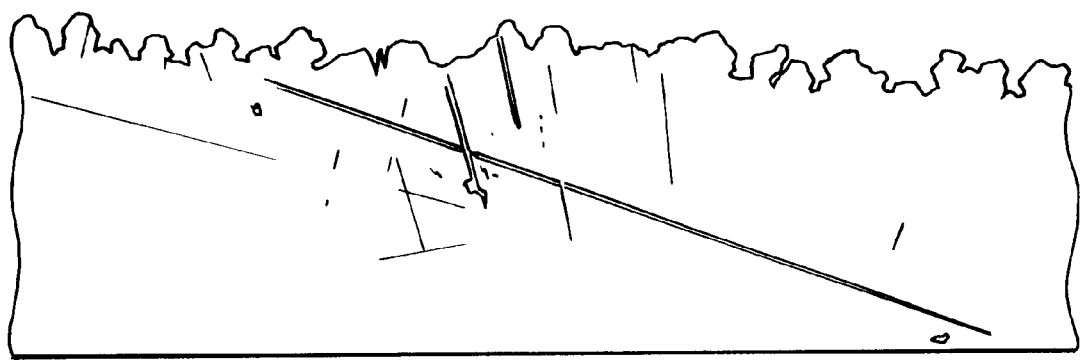
FIG. 1 is an illustration of a conductive coating and metal layer on the applied dielectric material with a desirable tooth structure.
Figure 2:
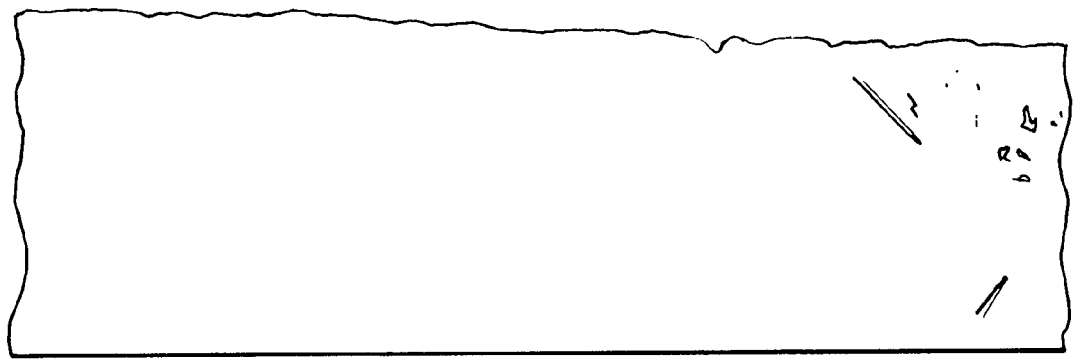
FIG. 2 is an illustration of a prior art conductive coating and metal layer on the applied dielectric material with the surface produced by roughening processes.

FIG. 1 is an illustration of a conductive coating and metal layer on the applied dielectric material with a desirable tooth structure. In contrast, FIG. 2 is an illustration of a prior art conductive coating and metal layer on the applied dielectric material with the surface produced by roughening processes. In both FIGS. 1 and 2, the darker area is the dielectric material, and the lighter area is a combination of a thin conductive coating and a metal layer. Compare FIG. 1 and FIG. 2, and note particularly the size, shape, frequency, and depth of the teeth in FIG. 1 with the surface produced by roughening in FIG. 2.

A way of articulating this "teeth" concept is to view each tooth as being made of one layer and set in a second layer. However, the perspective is arbitrary, and one could equally view each tooth as made of the second layer set in the first. It could also be said that the layers join in a saw-toothed manner, i.e., teeth made of both materials in an interlocking bite. In any case, however, there are teeth, and for the sake of consistency, this specification will adopt the convention of referring to the teeth as being made of the conductive coating and metal layer set in the dielectric material.

A further way of articulating the "teeth" concept is to view each tooth as being substantially triangular in shape, with the base of the triangle being defined by a plane of the applied dielectric material before it is etched, or more precisely by the exterior surface thereof. The invention can be carried by forming cavities in the applied dielectric material 6 for receiving the teeth, and then forming the teeth from the conductive coating and metal layer formed thereon. Generally, the teeth can be of any triangular shape (e.g., equilateral, isosceles, scalene, right, obtuse, or any combination thereof). Preferably, though, the teeth are obtuse so as to hook or angle under the exterior surface of the applied dielectric material.

The use of any shape of teeth increases the surface area where the conductive coating is on the applied dielectric material. However, the preferred embodiment utilizes a surface of obtuse, canine, or fang-shaped teeth to help the conductive coating and metal layer hook under the exterior surface of the applied dielectric material to mechanically grip the applied dielectric material. The obtuse, canine, or fang-shaped teeth are in contrast to the shallower, more rounded surface typically produced by known roughening techniques. Note in FIG. 2 that roughing techniques can produce some occasional gouging, but nothing on the order of the present invention.

As to size of the teeth, as mentioned above, it is preferable that the teeth be within a certain size range. The optimal size range for obtuse, canine, or hook-shaped teeth involves a balance between maximizing surface area and mechanical grip, but not undercutting the surface of the applied dielectric material 8 to such an extent as to weaken it. Accordingly, the teeth should be sized at least 1 tenth of a mil deep. Better is at least 1.25 tenths of a mil deep, and even better is at least 1.5 tenths of a mil deep. However, 1.75 tenths of a mil is acceptable, and about 2 tenths of a mil is reaching the limit.

As to frequency, the teeth should be quite frequent in number; at least about 5,000 teeth per linear inch, and preferably at least about 10,000 teeth per linear inch; and even better is at least about 15,000 teeth per linear inch.

As to surface area, there should be at least about 25,000 teeth per square inch, better still is essentially at least about 100,000 per square inch, and preferably at least about per square 200,000 per square inch, or even greater.

It should be recognized that the teeth generally are not formed to a precise dimension. As shown in FIG. 1, some of the teeth are somewhat differently sized, angled, and proportioned. Thus, a representative sample of the electrical device should have teeth in about these ranges. Having at least about 20% of the teeth in one or more of these ranges, and preferably at least 50%, is a preferred balance of mechanical grip without a weakening the integrity of the layering, particularly in combination.

As illustrated in FIGS. 3–11, there is an electrical device, such as a printed circuit board 2 having a base 4. The base 4 has a conductive layer 6 thereon. A dielectric material 8 is applied on the conductive layer 6, and a conductive coating 10 (such as a thin coating of palladium) is deposited on the dielectric material 8. Metal layer 12 is formed on the conductive coating 10.

Figure 3:
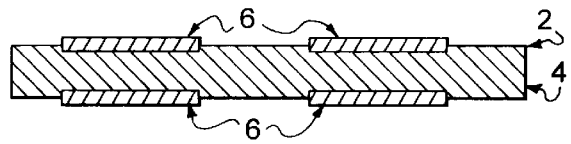
FIG. 3 is an illustration of a double sided printed circuit board without plated through holes.
Figure 5:
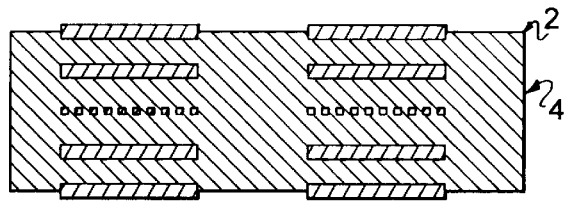
FIG. 5 is an illustration of a multilayer printed circuit board without plated through holes.
Figure 6:
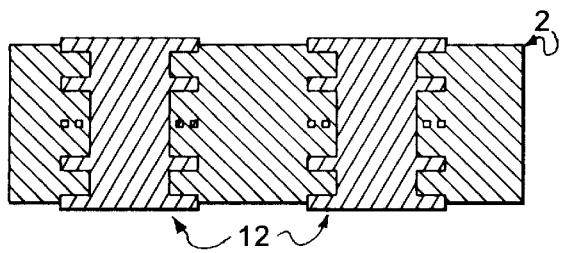
FIG. 6 is an illustration of a multilayer printed circuit board having more than two layers with plated through holes filled or unfilled with conductive or nonconductive material.

FIG. 3 illustrates one of the many ways to begin the process of forming the teeth in accordance with the present invention. A first step (step 1), includes providing a base 4 for constructing an electrical device, such as a printed circuit board 2. FIG. 3 illustrates one such construction, namely a base 4 for constructing a multilayer printed circuit board 2, the base 4 having any positive number of layers or laminates, for example the two layers shown in FIGS. 3 and 4, or more than two layers as illustrated in FIGS. 5 and 6, etc. One configuration or another is not significant, except that multiple layers provide a better medium for constructing circuitry of increased complexity or density. FIGS. 3–6 illustrate an embodiment in which the conductive layer 6 is on at least an upper side, and preferably also on a lower side of the base 4.

Figure 4:
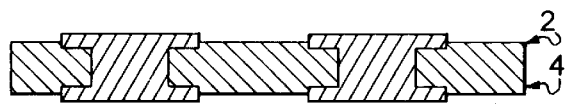
FIG. 4 is an illustration of a multilayer printed circuit board with plated through holes, filled or unfilled with conductive or nonconductive material.

As may be needed for a particular circuitry design, FIG. 4 illustrates that the electrical device can be further manipulated, for example, by forming through holes 12 by mechanical drilling, laser drilling, punching, or the like. The plated through holes 12 are shown in FIGS. 4 and 6 as filled or unfilled with a conductive or a nonconductive material.

FIG. 5 illustrates a configuration for the multilayer printed circuit board 2 with base 4 having more than two layers or laminates, the conductive layers 6 located there between.

FIG. 6 shows the multilayer printed circuit board 2 after forming, plating, and if needed, filling the through holes 12 in the manner of FIG. 4.

To summarize, step 1 of the process includes providing a base 4 for forming an electrical device such as a printed circuit board 2, wherein the base 4 can be formed to have one or more layers or laminates. At least one conductive layer 6 is on the base 4. The base 4 can be double sided with the conductive layer 6 being located outside the base 4 and between the layers or laminates.

The printed circuit board 2 can be further prepared, as may be desirable for a particular circuitry design, by forming open through holes 12 and plating and if needed, filling the through holes 12 to electrically connect to that portion of the conductive layer 6 appropriate for whatever circuitry design is being constructed, e.g., each side of a double sided circuit board 2. In other words, step 1 involves providing one of the configurations described in FIGS. 3–6.

Step 2 includes preparing an outer-most surface of the conductive layer 6 for any of the above-mentioned configurations. The step of preparing is carried out to enable adherence, e.g., of the applied dielectric material 8 to the conductive layer 6, preferably in a manner that utilizes a respective tooth structure. The step of preparing can be carried out, for example, by using an oxide or an oxide replacement process to treat the conductive layer 6 to such an extent that the teeth (or cavities for teeth) are formed.

As to using an oxide process, a copper oxide can be chemically deposited on a copper surface to produce a tooth-like structure on the surface of the copper. This process is carried out to prepare the copper surface prior to applying another layer of material, thereby providing increased bond strength between the two materials.

As to using an oxide replacement process to form a tooth structure, a micro etch on the surface of the copper is followed by a coating of an adhesion promoter to enhance a bond between copper and the dielectric material 8. For example, Alpha Metals, Inc. offers a PC-7023 product which is suitable for an oxide replacement process.

Figure 7:
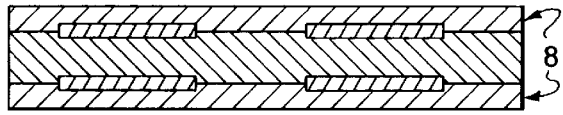
FIG. 7 is an illustration of any of the foregoing printed circuit boards after applying a dielectric material thereon.
Figure 8:
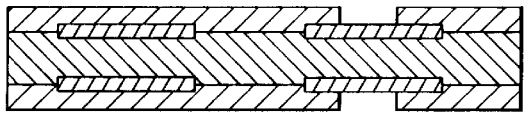
FIG. 8 is an illustration of the multilayer printed circuit board of FIG. 7 after forming micro vias.

Step 3 includes applying the dielectric material 8 to the outermost surface of the conductive layer 6 (and the base 4 if appropriate for the circuitry or electrical device at issue) prepared in accordance with the step 2. The dielectric material 8 can be applied by as a (dry) film, a (liquid) curtain coating, a (liquid) roller coating, or an analogous application or bonding technique. FIG. 7, in comparison with FIGS. 3–6, illustrates the dielectric material 8 on the outermost surface(s) of the conductive layer 4 (and the base 2).

Step 4 includes preparing the applied dielectric material 8 for receipt of a conductive coating 8, which to exemplify, is detailed more particularly below. Generally, though, the preparing step 4 can include exposing, developing, and curing the applied dielectric material 8 to form patterns for further construction of the circuitry, including such features as constructing a via or photo via 14, for optionally filling by conductive or non-conductive materials, e.g., screened, roller coated, etc. Compare FIGS. 6 and 7.

Figure 9:
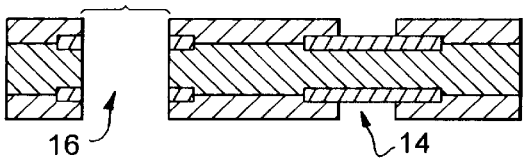
FIG. 9 is an illustration of the multilayer printed circuit board of FIG. 7 after opening the through holes and after etching the applied dielectric material to produce the teeth illustrated in FIG. 1.
Figure 10:
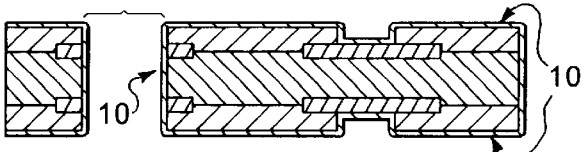
FIG. 10 is an illustration of the multilayer printed circuit board of FIG. 9 after application of a conductive coating to fill in around the teeth and connect micro via holes and the through holes.
Figure 11:
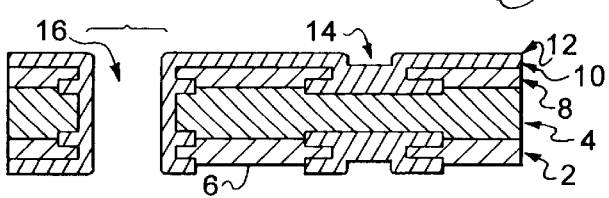
FIG. 11 is an illustration of the multilayer printed circuit board of FIG. 10 after plating the conductive coating to form a metal layer and complete forming circuitry.
Figure 1:
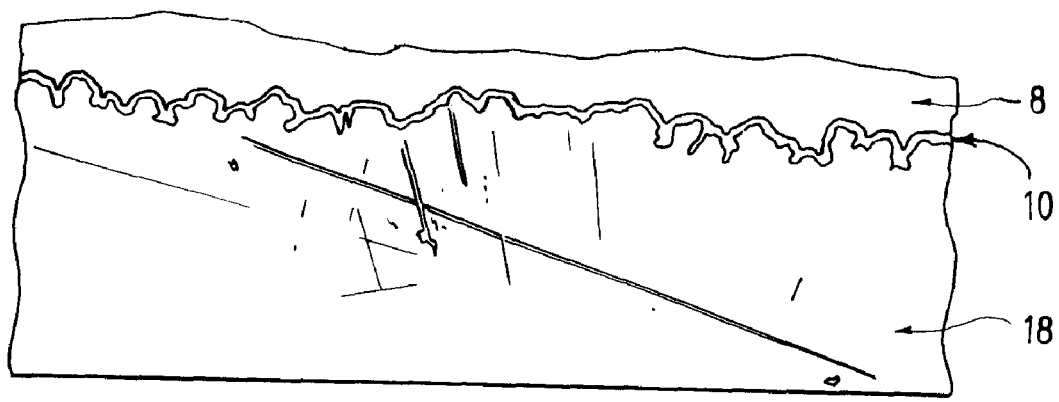
Figure 2:
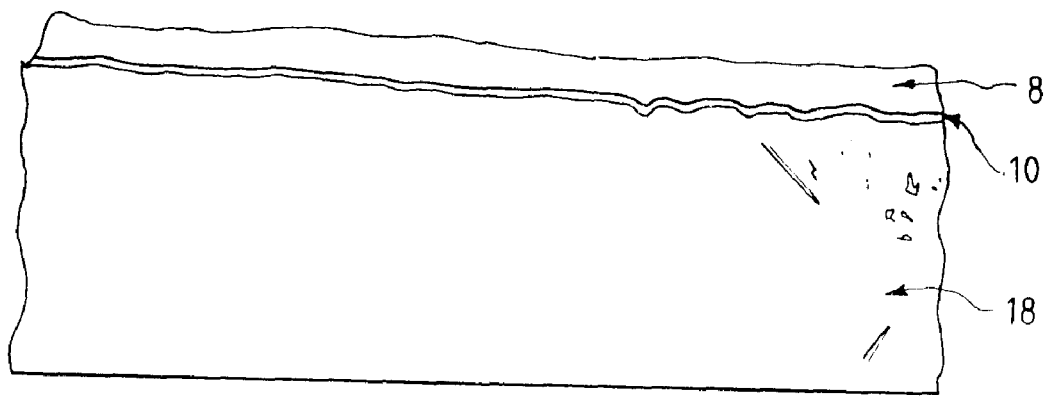

Step 5 includes forming open through holes 16 as shown in FIG. 9. As indicated above with regard to filled through holes 12, the open through holes 16 can be formed by such methods as drilling, boring, punching, and the like.

Step 6, as discussed subsequently in greater detail, involves the etching cavities, veins, openings, or gaps in the applied dielectric material 8, or more particularly an outermost surface thereof, to accommodate the teeth. One technique for forming the teeth is somewhat similar to what has been known as the swell and etch or desmear process, except that contrary to all known teachings in the prior art, in effect, a "double desmear process" is utilized. That is, not merely increasing the times and temperatures and other parameters for the desmear process, but instead completing the process a first time, and then completing the process a second time. Consider using the following Shipley products for the double desmear process: CIRCUPOSIT MLB conditioner 211, promoter 213B, and neutralizer 216. Non-homogeneous materials and/or processes seem to be determinative.

Step 7 includes applying a conductive coating 10 to the cavities in the applied dielectric material 8. The conductive coating 10 is also applied to the photo-defined via holes 10 and the open through holes 16. Techniques for applying the conductive coating 10 include a direct plate process or an electroless copper process. To carry out the present invention, it is preferable to use a palladium-based direct plate process or other non-electroless process. In this regard, a Crimson product of Shipley is suitable, though the desmear process as disclosed herein is contrary to the manufacturer's specifications, i.e., a "double desmear process," rather than the single desmear process of the known prior art. Compare FIGS. 1, 2, and 9.

Step 8 includes forming a metal layer 18 on the conductive coating 10, by such metal deposition techniques as electrolytic or non-electrolytic plating, to form the tooth structure and teeth as discussed The metal layer 18 and conductive coating 10 collectively form circuitry on the outermost surface of the applied dielectric material 8, which can connect to whatever portion of conductive layer 6 as may be needed for a particular design, preferably by making at least one connection through a micro via. See FIG. 10. A direct plate process, followed as needed by say a semi-additive or fully additive pattern plating process, is recommended.

A direct plate process is a replacement for traditional electroless copper plating of non-conductive surfaces. Direct plate processes apply a very thin conductive coating (e.g., using palladium or graphite) to the non-conductive surface, thus enabling electroplating of copper or other conductive material onto the previously non-conductive surface. Thus, "direct plate" is used to describe directly plating onto a non-conductive surface without first requiring a non electrolytic (electroless) plating process.

A semi-additive plating process involves first electroplating a thin conductive layer onto the total non-conductive surface, before applying a photoresist and subsequently pattern plating the required circuitry. For semi-additive plating, the thin conductive layer must be removed (etched) from the non-conductive surface. For fully additive plating, photoresist is applied directly on the non-conductive surface, followed by pattern plating the required circuitry (after applying the thin conductive coating in the direct plate process). That is, the fully additive plating forms only the required circuitry and requires no etching.

It should be recognized that the present invention can optionally be carried out by initially skipping step 5 (forming the open through holes 16) during initial "sets" of the foregoing steps, i.e., completing steps 6 and 7; then repeating steps 2 through 8, again skipping step 5 each time until the last set of steps, as required to form the electrical device or circuitry of interest. This will produce an electrical device with a second tooth structure that is not set in the first layer of dielectric material 8, and indeed the idea of using a toothed structure is not limited to any one layer and is best employed in holding multiple layers together. Step 5 can be carried out after the desired layers have been formed.

Turning now more particularly to the process for forming the teeth and the cavities for the teeth, the present invention can be carried out by a new use of a Ciba-Geigy product known as Probelec XB 7081 as a photoimagable dielectric material 8. Generally, and in accordance with its specification sheet, Probelec XB 7081 is a single component, 100% epoxy photodielectric material specially developed for Sequential Build Up (SBU) of multilayer boards.

Probelec XB7081 is a negative working, high resolution liquid photo-imageable (LPI) material which allows mass-forming of micro vias for fabrication of high-density interconnects (HDI). Compatible with conventional plating and circuitization techniques, Probelec XB 7081 also provides outstanding electrical and physical properties for most circuit board applications, and is compatible with most circuit board substrate materials.

Probelec XB 7081 is specially developed to act as a dielectric between circuit layers in fabrication of blind and buried micro via MLBS. The high resolution photo dielectric allows mass forming of micro vias for the construction of high density interconnects. Probelec XB 7081 has wide process latitudes, excellent handling characteristics, and is known as self-leveling and having an adjustable dry thickness of 1–3 mils. Probelec XB 7081 has a high resolution capability of 1–2 mil micro vias, and is known for chemical resistance, even for additive plating; there are excellent electrical and physical properties and a UL 94V-0 rating. Probelec is specified to demonstrate more than a 6 lb/in peel strength. By application of this invention this peel strength should be significantly increased due to the formation of the teeth. Accordingly the peel strength produced in accordance with the present invention is greater than the peal strength produced by the desmear process of the prior art, i.e., a single pass desmear process. For example, if a prior art desmear process is used to produce a 6 lb/in average peel strength, the present invention may produce an average peel strength on the order of 10 lb/in or more.

As to the general properties of Probelec XB 7081, there is a storage stability (1-component system) for more than 6 months at 25° C.; the pot life in a coater machine is more than 1 week; the hold time of the coating is more than 1 week (dark or exposed) and more than 1 day in yellow light.

When using Probelec XB 7081 to carry out the above-mentioned step 3 of applying a coating of the dielectric material, there is a pre-cleaning sub-step A. Pre-cleaning should be carried out in chemical, mechanical brushing, or pumice spray units. Extra precaution is needed to ensure that the pre-cleaning equipment and chemistry is not contaminated by materials from previous processing steps. Contrary to Ciba specifications, it is preferred to use an oxide or oxide replacement to prepare the surface prior to applying a coating of the dielectric. Hold times after pre-cleaning should be minimized to avoid oxidation of copper surfaces. In all coating applications, pre-cleaned substrates should be free of particles. Additional cleaning steps, e.g., with detergents, may be required to remove organic residues.

Next there is a coating sub-step B. Probelec XB7081 seems to have been primarily designed for curtain coating and is delivered with a solid content of 58%. Substrates should be heated to about 40° C. prior to coating to ensure all residual moisture is removed and to prepare substrate for curtain coating. For initial charging of a coater machine, Probelec XB 7081 needs to be premixed with about 15% of PMA (PMA is 1-methoxy-2-propyl acetate) to ensure proper viscosity. The additional PMA thins the coating down to about 50% solids.

The resin temperature should be 25±1° C., with a conveyor speed of 90 m/min. The viscosity is at 25° C., DIN AK4 cup at 60 sec. (400 cps), with a coater gap width of 500 mm. The wet weight is 7.5–10.0 gms/600 CM sq. and 11.6–15.5 gms/ft sq. The dry thickness is 45–60 mm.

Next is a flash dry sub-step C. Coated panels must be held in a horizontal position under dust-free conditions to air dry. At this stage, minimal air flow is recommended. The drying time is 12–18 min. at a drying temperature of 30–40° C.

Next is a final dry sub-step D. After flash air drying, final drying at an elevated temperature is needed to achieve better than 95% removal of solvents for tack-free handling. This can be accomplished in batch or conveyorized tunnel ovens, as follows:

|  | Tunnel Oven | Batch Oven |
| --- | --- | --- |
| Drying Temperature: | 130–140° C. | 90° C. |
| Drying Time: | 2–3 minutes | 30 minutes |

After cooling, the panels can have a second side coating (sub-steps A through D) if appropriate for the circuit design, and then for an exposure sub-step E.

In the exposure sub-step E, catalyst for cross linking of epoxy resin is generated. The main spectral sensitivity of Probelec XB 7081 is in the range of 350–420 nm. Conventional exposure units, collimated or non-collimated, with peak spectral emission of 365 nm are recommended. Both diazo and silver halide films are suitable as working phototools. Good artwork to coating contact is essential for consistent micro via reproduction. The exposure energy is 1200–1600 mJ/cm sq. and the exposure time (7kW) is 30–40 seconds. The Stouffer Step (21 scale) is 5–7.

Next is a thermal bump step F. Thermal bump provides the energy for crosslinking the catalyzed epoxy resin. This process can be done in convection batch or conveyorized tunnel ovens. For a batch oven, 110° C. for 60 min. is appropriate, and for a conveyorized tunnel oven, 130° C. for 10–20 min. is appropriate.

Next is a developing sub-step G. The unexposed areas of Probelec XB7081 are developed away in continuous spray developing machines. Various models with different processing capacities are available for this purpose. A Ciba-Geigy product DY 950 (Gamma-Butyrolactone (GBL)) developer is recommended for processing Probelec XB7081. This developer is a halogen-free, high-boiling organic solvent suitable for on-site distillation or recycling. Probimer 450/470 spray developing equipment is specially designed for use with this developer solution. The temperature is 20±2° C., and the spray pressure is 2–4 bar. The speed for Probimer 450 is 2–3 m/min; for Probimer 470, 3–4 m/min.

Next is a final cure sub-step H. Final thermal curing is needed to impart good mechanical, chemical, and electrical properties to the dielectric film. The thermal curing can take place in batch or conveyorized tunnel ovens. The thermal curing temperature is 150° C., with a thermal curing time of 60 minutes.

Next can come the step 5 of further preparing, for example, by forming through holes 16. If plated through holes 16 (PTH's) are needed for interconnecting layers to the bottom or back side of the printed circuit board 2, drilling should of course be done before plating. This allows the plating of the surface together with the through holes 16. Plating and such post-processing of the photoimagable dielectric material 8 is dependent on particular process preferences. Probelec XB7081 is compatible with panel-plate, pattern-plate or additive plating.

The following process sub-steps of the above-mentioned step 6 describe a generic sequence for a desmear process to form cavities in the dielectric. Although Probelec XB7081 apparently was intended for use in the common desmear (swell and etch) process as used in conventional plated through hole plating lines, Probelec XB7081 can alternatively be used in carrying out the present invention. For example, the present invention differs from the common desmear process in that sub-steps in the desmear process are repeated as a way of forming the teeth. Sub-step A, swelling the dielectric material 8, can be carried out with butyl diglycol/sodium hydroxide/water 80° C. for 3–5 minutes. Sub-step B is rinsing the dielectric material 8 in deionized water at room temperature for 4 minutes. Sub-step C is etching the dielectric material 8, which can be carried out using potassium permanganate/sodium hydroxide/water 80° C., 6–10 minutes. Sub-step D is rinsing the dielectric material 8 in deionized water at room temperature for 4 minutes. Sub-step D includes a further rinsing of the dielectric material 8 in deionized water at room temperature for 4 minutes. Sub-step E is neutralizing the dielectric material 8 in sulfuric peroxide (1.5%) for 3 to 5 minutes. Finally step F is rinsing the dielectric material 8 in deionized water at room temperature for 4 minutes.

In stark contrast with the etch and swell process of the known prior art, however, a second pass through the process (sub-steps A through F) is used. The second pass seems to make use of non-homogenaities in bringing about a formation of the teeth. Thus, unlike the prior swell and etch chemical roughening process, which produces a surface characterized by a surface gloss measurement at an angle of 60° which is between 15 and 45%, the present invention has less gloss (<10%).

Turn now in greater detail to the step 7 of applying the conductive coating 10 for subsequent deposition of the metal layer 18 by, say, plating. Good results can be achieved with a flash plate of 0.7–1.0 mm (30–40 micro inches). The flash plate is followed by baking at 130–150° C., for 2 hours.

For pattern plating, plating resist can be applied after baking. Depositing the metal layer 18 by electroplating can be carried out such that there is 10–25 mm (0.4–1.0 mil.).

While a particular embodiment of the present invention has been disclosed, it is to be understood that various different modifications are possible and are within the true spirit of the invention, the scope of which is to be determined with reference to the claims set forth below. There is no intention, therefore, to limit the invention to the exact disclosure presented herein as a teaching of one embodiment of the invention.

We claim:

1. A method for making an electrical device, the method comprising the following steps:

providing a base; adding a conductive layer to the base;

applying a dielectric material to the conductive layer;

forming cavities in the applied dielectric material;

applying a conductive coating to the cavities in the dielectric material;

forming a metal layer on the conductive coating to produce a tooth structure set in the dielectric coating but not set in the conductive layer;

forming openings in the dielectric coating; and forming circuitry through the openings and on the electrical device to produce a multilayer circuit board.

2. The method of claim 1, wherein the step of forming cavities includes more than one set of sub-steps including:

swelling the dielectric material;

rinsing the dielectric material;

etching the dielectric material;

rinsing the dielectric material;

neutralizing the dielectric material; and rinsing the dielectric material.

3. The method of claim 1, wherein the step of applying a dielectric material and the step of preparing the dielectric material are carried out to produce a peel strength greater than the peel strength than that of a single desmear process.

4. The method of claim 1, wherein the steps of preparing the base and adding a conductive layer to the base are carried out by a process from the group consisting of an oxide and an oxide replacement processes.

5. The method of claim 1, wherein:

the step of applying a conductive coating is carried out by direct plating on the dielectric material.

6. A printed circuit board made by the process of claim 1.

\* \* \* \* \*

UNITED STATES PATENT AND TRADEMARK OFFICE
CERTIFICATE OF CORRECTION

PATENT NO. : 6,141,870
DATED : November 7, 2000
INVENTOR(S) : McDermott et al.

It is certified that error appears in the above-identified patent and that said Letters Patent is hereby corrected as shown below:

Delete title page and substitute the attached title page.

Delete drawing sheet 1, and substitute the attached drawing sheet 1.

Signed and Sealed this

Thirty-first Day of January, 2006

JON W. DUDAS
*Director of the United States Patent and Trademark Office*

United States Patent [19]
McDermott et al.

[11] Patent Number: 6,141,870
[45] Date of Patent: Nov. 7, 2000

[54] METHOD FOR MAKING ELECTRICAL DEVICE

[75] Inventors: Brian J. McDermott, Winter Springs; Daniel McGowan, Casselberry; Ralph Leo Spotts, Jr., Lake Mary; Sid Tryzbiak, Winter Springs, all of Fla.

[73] Assignee: Peter K. Trzyna, Chicago, Ill.

[21] Appl. No.: 08/905,619

[22] Filed: Aug. 4, 1997

[51] Int. Cl.⁷ .................................................... H01K 3/10
[52] U.S. Cl. ................................ 29/852; 29/825; 29/830; 427/97
[58] Field of Search ........................... 29/852, 830, 825; 427/97

[56] References Cited

U.S. PATENT DOCUMENTS

| | | |
|---|---|---|
| 3,228,104 | 1/1966 | Rmeis . |
| 3,808,028 | 4/1974 | Lando . |
| 4,196,923 | 4/1980 | Zimmerli et al. . |
| 4,216,246 | 8/1980 | Iwasaki et al. . |
| 4,364,792 | 12/1982 | Gliem et al. . |
| 4,615,763 | 10/1986 | Gelorme et al. . |
| 4,642,163 | 2/1987 | Greschner et al. . |
| 4,688,015 | 8/1987 | Kojima et al. . |
| 4,700,879 | 10/1987 | Weidenauer et al. . |
| 4,832,988 | 5/1989 | Bogenschutz et al. . |
| 4,913,784 | 4/1990 | Bogenschutz et al. . |
| 4,927,983 | 5/1990 | Jones et al. . |
| 4,941,940 | 7/1990 | Gordhanbhai et al. . |
| 4,948,630 | 8/1990 | Courduvelis et al. . |
| 4,948,707 | 8/1990 | Johnson . |
| 4,978,569 | 12/1990 | Keep . |
| 4,997,122 | 3/1991 | Zimmer . |
| 5,015,329 | 5/1991 | Patel et al. . |
| 5,049,230 | 9/1991 | Patel et al. . |
| 5,058,799 | 10/1991 | Zsamboky . |
| 5,082,359 | 1/1992 | Kirkpatrick . |
| 5,097,593 | 3/1992 | Jones . |
| 5,108,825 | 4/1992 | Wojnarowski et al. . |
| 5,156,896 | 10/1992 | Katoh et al. . |
| 5,160,090 | 11/1992 | Friedrich et al. . |
| 5,178,965 | 1/1993 | Tench et al. . |
| 5,242,711 | 9/1993 | DeNatale . |
| 5,250,319 | 10/1993 | Ohsako . |
| 5,258,098 | 11/1993 | Waganer et al. . |

(List continued on next page.)

OTHER PUBLICATIONS

Alphametals Alpha–Fry Group; *Material Safety Data Sheet* Jul. 14, 1995 pp. 1–6 Circuposit (R) MLB Prometer 2/3A.
Shipley Company, Inc.; *Material Safety Data Sheet* Oct. 23, 1995 pp.1–6.
Problec XB 7081 Photodielectric; *Provisional Technical Data Sheet* Oct. 1996 pp. 1–8.
Shipley Company Inc.; *Material Safety Data Sheet*, Circuposit MLB Conditions 211 Sep. 7, 1996 pp. 1–6.
Shipley Company Inc.; *Material Safety Data Sheet*, Circuposit MLB Prometer 213B, Aug. 15, 1996 pp. 1–6.
Shipley Company Inc.; Material Safety Data Sheet, Circuposit MLB Neutralizer 216 Aug. 15, 1996, pp. 1–4.

*Primary Examiner*—Carl J. Arbes
*Attorney, Agent, or Firm*—Peter K. Trzyna

[57] ABSTRACT

A multilayer electrical device such as a printed circuit board, and method for making the electrical device, having a tooth structure for joining at least one of the layers. The method includes the following steps: providing a base; preparing the base and adding a conductive layer to the base; applying a dielectric material to the conductive layer; preparing the applied dielectric material for receipt of the conductive coating; forming openings (vias) through holes in the applied dielectric coating; etching cavities in the applied dielectric material; applying a conductive coating to the cavities in the applied dielectric material; and forming a metal layer on the conductive coating to produce a tooth structure set in the dielectric coating. The tooth structure preferably has obtuse teeth in the range of 1–2 tenths of a mil deep that mechanically join a dielectric material to a subsequently added metal layer.

6 Claims, 2 Drawing Sheets

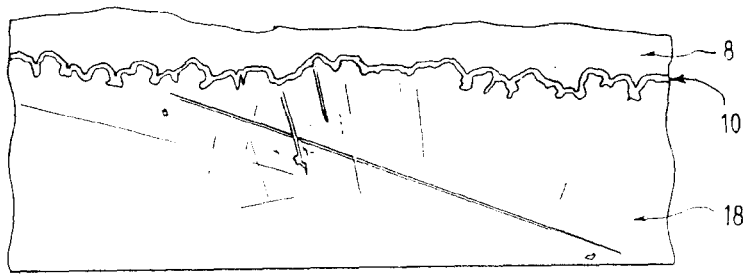

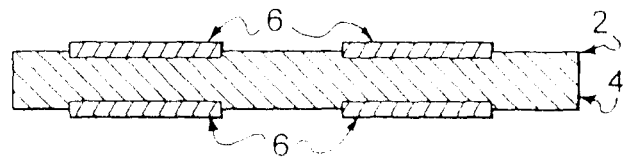

UNITED STATES PATENT AND TRADEMARK OFFICE
CERTIFICATE OF CORRECTION

PATENT NO. : 6,141,870
APPLICATION NO. : 08/905619
DATED : November 7, 2000
INVENTOR(S) : McDermott et al.

It is certified that error appears in the above-identified patent and that said Letters Patent is hereby corrected as shown below:

In the Claims

Column 9, line 26, after conductive, delete "coating" and there insert --material--.

Column 9, line 27, after dielectric, delete "coating" and there insert --material--.

Column 10, line 1, after dielectric, delete "coating" and there insert --material--.

Signed and Sealed this
First Day of September, 2015

Michelle K. Lee
*Director of the United States Patent and Trademark Office*